United States Patent [19]

Barazesh et al.

[11] Patent Number: 4,787,065

[45] Date of Patent: Nov. 22, 1988

[54] DATA PROCESSING APPARATUS PROVIDING CYCLIC ADDRESSING OF A DATA STORE IN SELECTIVELY OPPOSITE DIRECTIONS

[75] Inventors: Bahman Barazesh, Paris; Luc Mary, Bures Sur Yvette, both of France

[73] Assignee: Telecommunications Radioelectriquetes et Telephomiques T.R.T., Paris, France

[21] Appl. No.: 153,526

[22] Filed: Feb. 3, 1988

Related U.S. Application Data

[63] Continuation of Ser. No. 711,544, Mar. 13, 1985, abandoned.

[30] Foreign Application Priority Data

Mar. 13, 1984 [FR] France ............... 84 03813

[51] Int. Cl.$^4$ ............... G11C 7/00; G11C 21/00
[52] U.S. Cl. ............... 364/900; 364/724.16; 364/724.19; 375/14
[58] Field of Search ... 375/14; 364/724, 200 MS File, 364/900 MS File; 365/236, 239

[56] References Cited

U.S. PATENT DOCUMENTS

| | | | |
|---|---|---|---|
| 3,141,151 | 7/1964 | Gilson | 364/900 |
| 4,016,543 | 4/1977 | Franks | 364/200 |
| 4,241,416 | 12/1980 | Tarczy-Hornoch | 364/900 |
| 4,280,199 | 7/1981 | Osakabe et al. | 365/236 |
| 4,422,175 | 12/1983 | Bingham et al. | 364/724 |
| 4,462,074 | 7/1984 | Linde | 364/200 |
| 4,628,532 | 12/1986 | Stone et al. | 382/21 |
| 4,638,457 | 1/1987 | Schrenk | 365/236 |

FOREIGN PATENT DOCUMENTS

| | | | |
|---|---|---|---|
| 114950 | 7/1982 | Japan | |
| 33688 | 8/1982 | Japan | 365/236 |

*Primary Examiner*—Gary V. Harkcom
*Assistant Examiner*—Lawrence E. Anderson
*Attorney, Agent, or Firm*—Thomas A. Briody; Leroy Eason

[57] ABSTRACT

A data processing apparatus in which a memory (10) is accessed at addresses stored in an address regiser (20). An incrementation circuit (38) successively increments or decrements the address stored in the principal register, under the control of an address cycling circuit (22). A pair of auxiliary registers (30, 35) respectively store the minimum and maximum address values to be reached in the principal register, and a comparison circuit (37) determines when the address therein matches the minimum or maximum value. The address cycling circuit, together with the comparison circuit, loads the principal register with the minimum address value when the address therein reaches the maximum value, the address therein thereafter being decremented, and loads it with the maximum address value when the address therein reaches the minimum value, the address therein thereafter being incremented. Such operation is particularly useful for preforming the functions of a fixed or adaptive transversal filter for data transmission, the data stored in the memory being the filter coefficients.

3 Claims, 3 Drawing Sheets

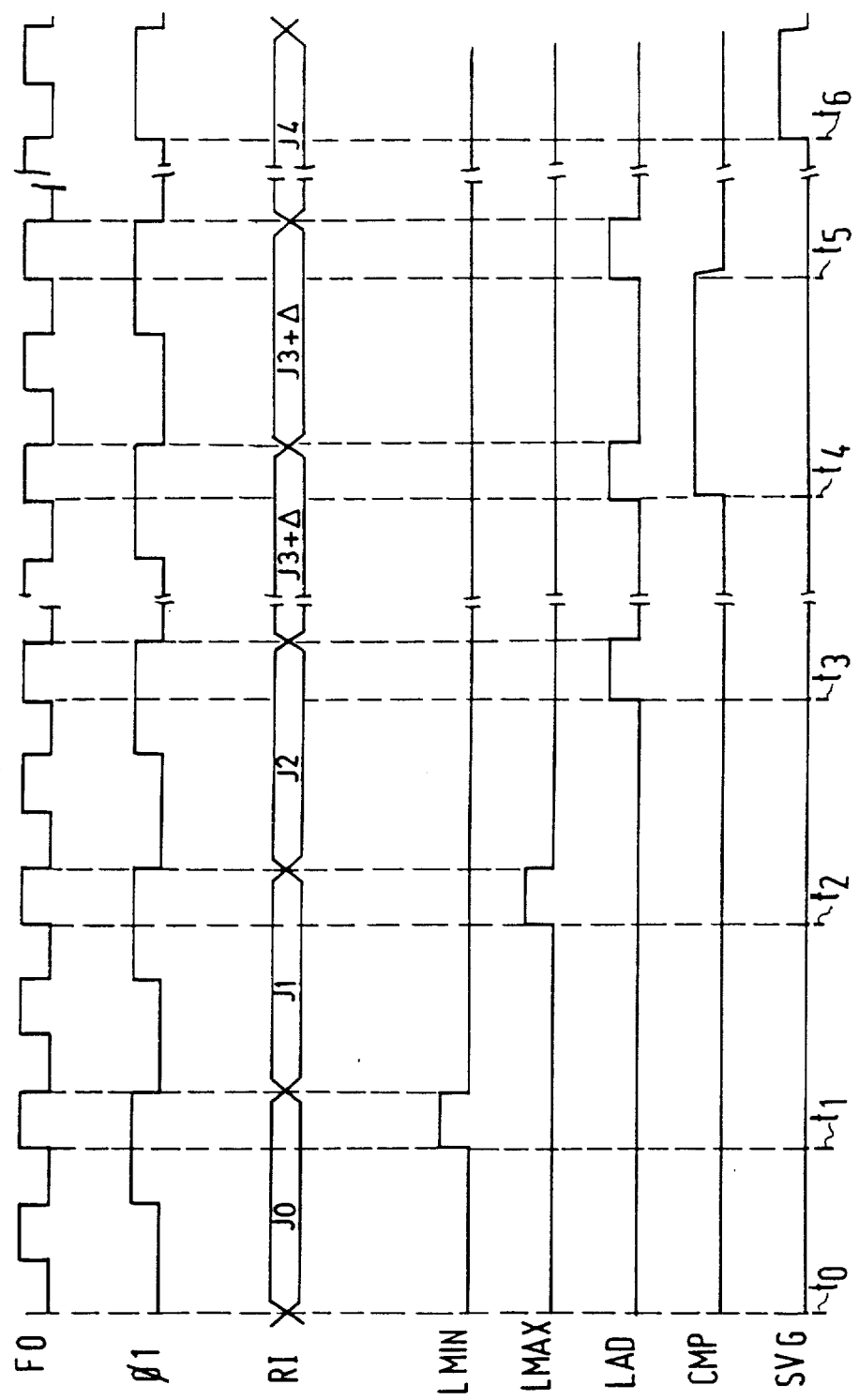

DATA PROCESSING APPARATUS PROVIDING CYCLIC ADDRESSING OF A DATA STORE IN SELECTIVELY OPPOSITE DIRECTIONS

This is a continuation of application Ser. No. 711,544, filed Mar. 13, 1985, now abandoned.

BACKGROUND OF THE INVENTION

1. Field of the Invention

The invention relates to a data processing apparatus, comprising an addressing arrangement for supplying a memory with address codes originating from a variable-content principal register to which are connected an incrementation circuit for modifying the content of the principal register and a loading circuit. The addressing arrangement comprises two auxiliary registers, one of which serves to store the minimum value to be reached by the content of the principal register while the other auxiliary register serves to store the maximum value to be reached by the principal register. A comparison circuit determines when the content of the principal register reaches the minimum and maximum values.

2. Description of the Related Art

Such a apparatus is widely used, notably for performing the functions of a fixed or adaptive transversal data transmission filter. At successive addresses the memory contains different samples in digital form of the signal to be filtered. For processing of the signal it is necessary to address the memory locations containing these samples cyclically, so as to simulate a shift register in RAM-type memory.

Apparatus of the kind set forth is described in the article "An LSI Signal Processor" by M. Yano, K. Inoue and T. Senba in volume 2 of IEEE International Conference of Acoustics, Speech and Signal Processing, held in Paris, France on May 3, 4, 5, 1982.

In the known apparatus the comparison circuit compares the content of the principal register with that of the auxiliary register containing the maximum value. Consequently, the content of the principal register must always be modified in the same direction in practice.

SUMMARY OF THE INVENTION

The present invention has for its object to provide a data processing apparatus of the kind set forth which enables modification of the content of the principal register in both direction.

To this end, the data processing apparatus in accordance with the invention is characterised in that the loading circuit which cooperates with the comparison circuit serves to load the principal register with the minimum value when it contains the maximum value and with the maximum value when it contains the minimum value.

An important advantage of the invention consists in that the addressing arrangement is very well suitable for operation with processors operating in the pipeline mode. In this mode of operation the results arrive with a delay because of the pipe-line effect. The use of the pipeline mode in filtering algorithms necessitates the execution of two operations on the same data at two different instants, which implies that the principal register must be incremented and decremented at will; therefore, the present invention can be used even in the vicinity of the maximum and minimum address code values, thereby providing increased flexibility for the choice of a memory section to be used.

An important feature of the invention is that the addressing arrangement can cooperate with a microprocessor system comprising an instruction bus and a data bus and is provided with connection means between the output of the principal register and the data bus in order to save the content of the principal register in the memory of the microprocessor system, thus enabling the realization of the functions of several independent transversal filters by means of the same system.

BRIEF DESCRIPTION OF THE DRAWINGS

The invention will be described in detail hereinafter with reference to the accompanying drawings.

FIG. 3 shows a time diagram illustrating the operation of the apparatus shown in FIG. 1.

DESCRIPTION OF THE PREFERRED EMBODIMENTS

Figure 1:
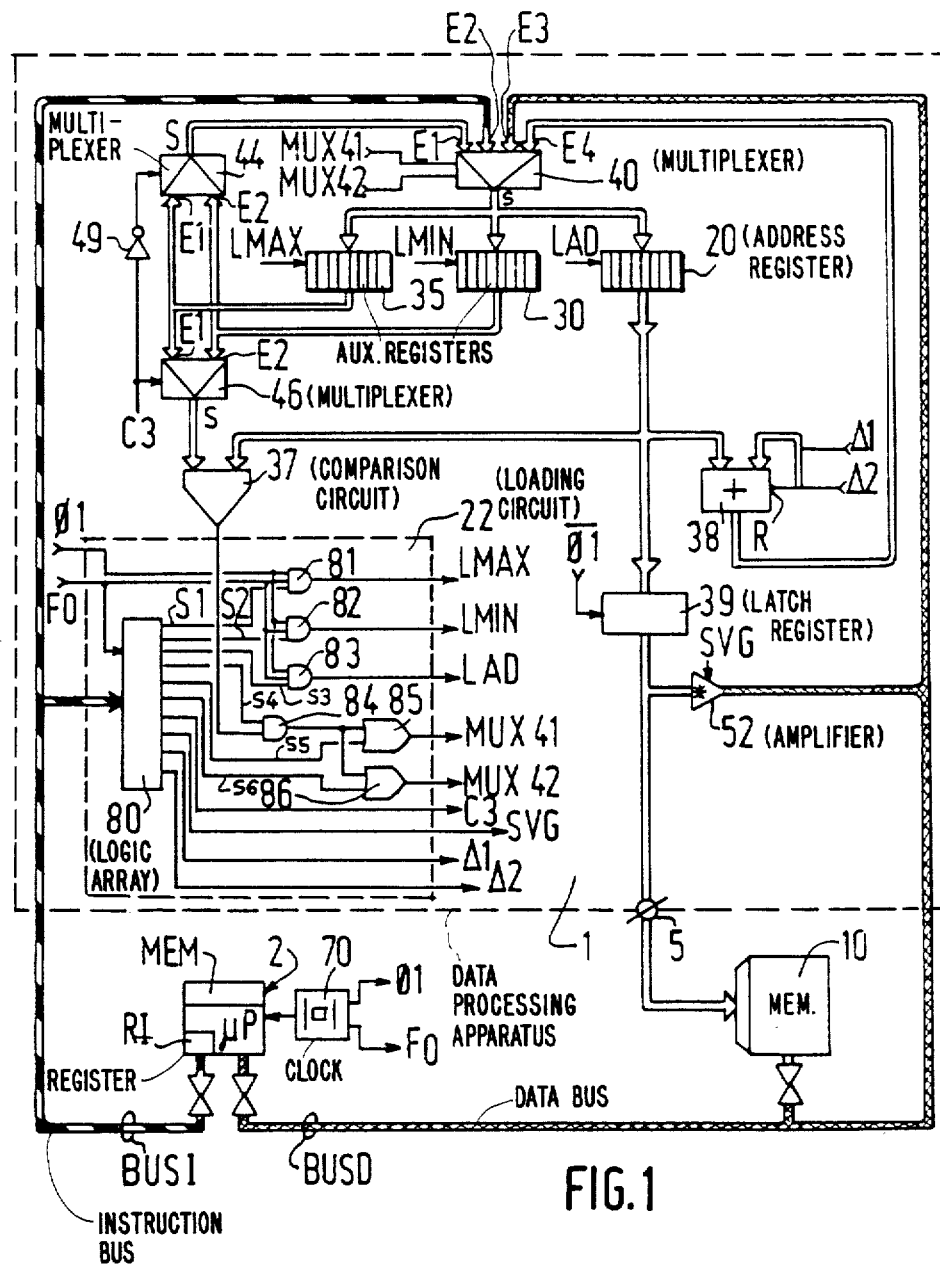
FIG. 1 shows a data processing apparatus in accordance with the invention.

The data processing apparatus shown in FIG. 1 is intended to cooperate with a microprocessor system 2. This system operates on the basis of instructions transported via a bus BUSI and originating from a register RI; data (results of calculations performed by the system 2) appear on a bus BUSD. The apparatus 1 supplies an address code for a memory 10 on its output 5. This code originates from a register 20 which is referred to as the principal register and whose content can be modified under the control of a loading circuit 22. To this end, a loading signal LAD for the register 20 is supplied from the circuit 22.

The apparatus 1 comprises two auxiliary registers, one of which is denoted by the reference numeral 30 and serves to store the mimimum value wherefrom the content of the principal register can be modified, while the auxiliary register (35) serves to store the maximum value to be reached by the principal register. There is also provided a comparison circuit 37 which cooperates with the loading circuit 22. An input of this circuit 37 is connected to the parallel outputs of the register 20. An incrementation circuit which is formed essentially by an adder 38 is used to vary the value stored in the memory 10 by $\pm \Delta$. A latch-type register 39 serves as an interface between the outputs of the register 20 and the output 5 which is connected to the address code input of the memory 10. This register 39 is set to the conductive state by the value "0" of a signal $\phi 1$.

In accordance with the invention, the loading circuit 22 cooperating with the comparison circuit 37 serves to load the principal register 20 with the minimum value (stored in the auxiliary register 30) when its content has reached the maximum value, and with the maximum value (stored in the auxiliary register 35) when its content has reached the minimum value.

The loading and incrementation operations are performed by means of a first multiplexer 40 which comprises four inputs E1, E2, E3 and E4. The input E1 is connected to the output S of a dual-input multiplexer 44, the input E2 to the instruction bus BUSI, the input E3 to the data bus BUSD, and the input E4 to the output of the adder circuit 38. The connection of one of these inputs E1 to E4 to the output S of the multiplexer 44 is controlled by two commands MUX 41, MUX 42. The inputs E1 and E2 of the multiplexer 44 are combined with the inputs E1 and E2 of a further multiplexer 46. The inputs E1 of the multiplexers 44 and 46 are connected to the parallel outputs of the register 35, and the inputs E2 of the multiplexers 44 and 46 are connected to the outputs of the register 30. The parallel inputs of the registers 20, 30 and 35 are all connected to the output S of the multiplexer 40. The multiplexers 44 and 46 are controlled by a signal C3 for the multiplexer 46 and by the signal $\overline{C3}$ obtained via the logic signal inverter 49. Thus, for one value C3 there is connection between the input E1 and the output S of the multiplexer 46, while a connection is established between the input E2 and the output S of the multiplexer 44 for the other value of C3.

The parallel outputs of the register 20 are connected, as has already been stated, to a first input of the comparator 37 whose second input is connected to the output S of the multiplexer 46.

The invention thus provides the means for cyclically addressing the addresses in memory 10, which means that using simple instructions for incrementing the memory counter by Δ, one progresses from the maximum address value ADM to the minimum address value Adm, i.e. sequentially: ADm, ADm+Δ, ... ADM −Δ, ADM, ADm, ADm+Δ ... or from the minimum address value ADm to the maximum address value ADM, ADM−Δ, ... ADm+Δ, ADm, ADM, ADM−Δ. Δ may have the typical values: 0, 1 ....

The adder circuit 38, whose operands are defined, for example by 7 bits, comprises a carry input "R". A value $\Delta_2$ is applied to "R" and to the six most significant inputs for an operand, and the seventh input receives the value $\Delta_1$. The seven inputs for the other operand are connected to the parallel outputs of the register 20.

The parallel outputs of the register 20 are also connected to the bus BUSD via a group of tri-state amplifiers 52 which are controlled by a signal SVG. The content of the register 20 can thus be saved in a location of a memory MEM forming part of the microprocessor 2. This enables the execution of several independent treatments. In the intended application, the functions of several transversal filters can be performed.

A clock 70 supplies the signals which control the processing speed of the microprocessor 2. From this clock 70 there are derived two periodic signals: the signal $\phi 1$ which determines the rate of appearance of the instructions on the bus BUSI and a signal F0 whose frequency is twice that of the former signal. These signals are used by the loading circuit 22. The loading circuit 22 is formed by a programmed logic array 80 which supplies the signals S1 to S6, C3, SVG, Δ1 and Δ2 on the basis of the data transported by the bus BUSI and the signal F0. Three AND-gates 81, 82 and 83 supply the loading signals LMAX, LMIN, and LAD for the registers 35, 30 and 20. Two of the three inputs of these gates receive the signal $\phi 1$ and F0 while the third input of these gates 81, 82 and 83 receives the signals S1, S2, and S3, respectively. A fourth AND-gate 84 receives the signal S4 on one of its inputs and its other input receives the signal CMP from the output of the comparator 37. Two OR-gates 85 and 86 supply the codes MUX 41 and MUX 42; one input of these gates is connected to the output of the gate 84, the other input of these gates 85 and 86 receiving the signals S5 and S6, respectively.

The array 80 is programmed so that the following logic equations are realized:

$$S_1 = I_0.I_1.I_2.\overline{I_3}.\overline{I_4}$$

$$S_2 = I_0.I_1.I_2.\overline{I_3}.I_4$$

$$S_3 = I_0.\overline{I_1}.\overline{I_2}.I_{28}.\overline{I_{29}}.I_{31} + \overline{I_0}.\overline{I_1}.I_3$$

$$S_4 = \overline{I_0}.\overline{I_1}.I_3.I_{25}$$

$$S_5 = I_0.\overline{I_1}.\overline{I_2} + \overline{I_0}.\overline{I_1}$$

$$S_6 = I_0.I_1 + \overline{I_0}.\overline{I_1}$$

$$C_3 = I_0.\overline{I_1}.I_{24}$$

$$SVG = (I_0.\overline{I_1}.I_2.\overline{I_3}.\overline{I_4}.I_5.\overline{I_6}.I_8.I_9).\phi$$

$$\Delta_1 = I_0.I_1.I_{25}.\overline{I_{24}} + I_0.I_1.\overline{I_{25}}.I_{24}$$

$$\Delta_2 = I_0.I_1.I_{24}$$

The symbol "." indicates a logic AND-operation in these equations, and the symbol "+" indicates a logic OR-operation. The variables $I_i$ represent the values of the bits transported by the bus BUSI.

For a proper understanding of the invention, the following Table I states the connections established by the multiplexers 44 and 46 as a function of signal the value of a signal C3, while Table II states the connections established by the multiplexer 40 as a function of the codes MUX 41 and MUX 42.

TABLE I

| C3 | Connections multiplexer 46 | Connections multiplexer 44 |
|---|---|---|
| 0 | E1-S | E2-S |
| 1 | E2-S | E1-S |

TABLE II

| MUX 41 | MUX 42 | Connection |
|---|---|---|
| 0 | 0 | E1-S |
| 0 | 1 | E2-S |
| 1 | 0 | E3-S |
| 1 | 1 | E4-S |

Figure 2:
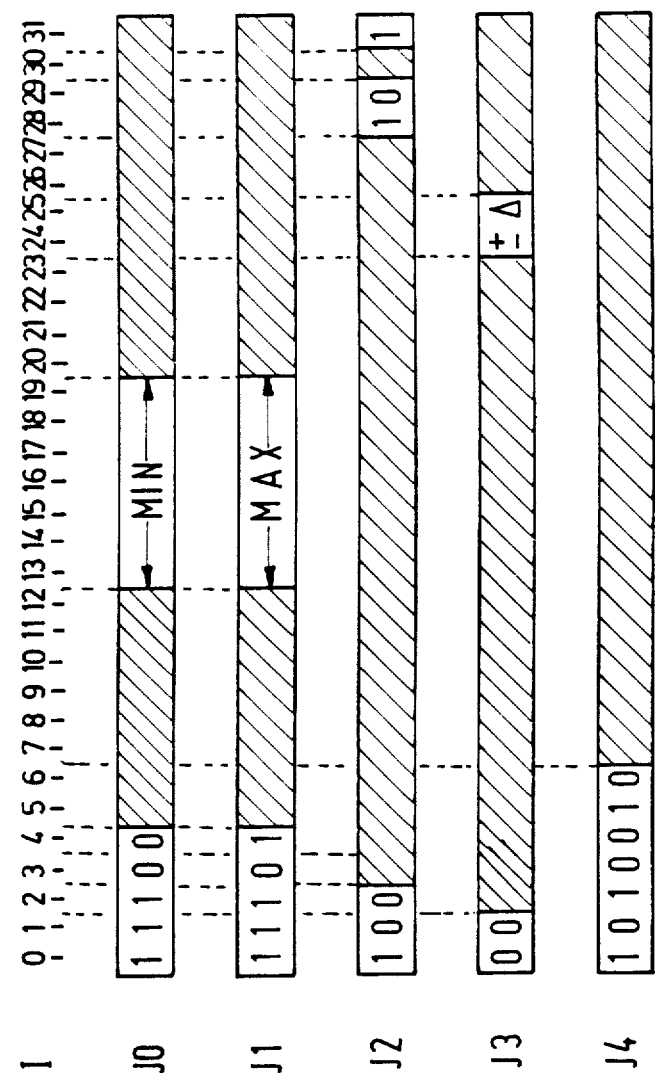
FIG. 2 shows the format of a number of instructions for the data processing apparatus.

For an explanation of the operation of the apparatus in accordance with the invention, use is made of the various instructions J0, J1, J2, J3 and J4 shown in FIG. 2. All instructions in question are formed by thirty-two bits denoted as $I_0$ to $I_{31}$.

In order to initialize the apparatus 1, it is necessary to use the instructions J0 and J1 which are characterised by $I_0 = I_1 = I_2 = 1$, $I_3 = I_4 = 0$ for J0 and by $I_0 = I_1 = I_2 = 1$, $I_3 = 0$, $I_4 = 1$ for J1, respectively. The instructions J0 and J1 enable the loading of the registers 30 and 35 with the values "MIN" and "MAX", respectively, determined by means of the bits $I_{13}$ to $I_{19}$.

For the loading of the register 20 use is made of the instruction J2 which is characterised by $I_0 = 1$, $I_1 = I_2 = 0$, $I_{28} = 1$, $I_{29} = 0$, and $I_{31} = 1$.

The value loaded into the register 20 arrives via the bus BUSD and may be any value between ADMIN and ADMAX at the start of processing.

When the same system is used for the realization of the functions of several transversal filters in timesharing, the value to be stored in register 20 is fetched for each filter from the memory MEM of the microprocessor and at the end of processing the content of the register 20 is returned to the memory for the next period.

The instruction J3 provides incrementation values Δ which are determined by the bit $I_{25}$ and whose positive or negative sign is given by the value of the bit $I_{24}$. The instruction J4 is used to save the content of the register 20 in the memory MEM. The instructions J3 and J4 are characterised by $I_0$ and $I_1$ equal to "0" to J3, and $I_0=1$, $I_1=0$, $I_2=1$, $I_3=I_4=0$, $I_5=1$, $I_6=0$ for J4. The operation of the addressing element will now be described with reference to the time diagram shown in FIG. 3.

The instructions J0, J1, J2 . . . J3 . . . J4 arrive in the register R1 shortly after the negative-going edge of the signal $\phi 1$.

At the instant $t_o$, the instruction J0 is decoded and the signals MUX 41 and MUX 42 assume a value such that the transmission of $E_2$ to S is established inside the multiplexer 40; at the instant $t_1$ the register 30 is loaded with the output data of the multiplexer 40.

During the next cycle, the instruction J1 is decoded and the position of the multiplexer 40 remains in the position for transmitting $E_2$ to its output S. Subsequently, at the instant $t_2$ the register 35 is loaded with the maximum value which can be reached by the register 20. During the next cycle the transmission of $E_3$ to S is established by the multiplexer 40 under the influence of decoding of the instruction J2. At the instant $t_3$ the register 20 is loaded with the output data of the multiplexer 40.

The addressing element is initialized for the supply of addresses as from the instant $t_3$.

The decoding of the instruction J3 results in a code MUX 41 and MUX 42 such that the transmission of $E_4$ to S is established. In the described example the register 20 is allowed to be incremented by positive values. After a given number of incrementation steps, at the instant $t_4$ the register 20 will contain a maximum value which is equal to the value stored in the register 35 and the signal CMP will assume the value 1. For the next instruction it is assumed that the desired incrementation is always positive. This condition, taking into account the value "1" of the signal CMP, results in the minimum loading of the register 20 with the value, which is stored in the register 30, at the instant $t_5$. To this end, the multiplexer 40 establishes the transmission of $E_1$ to S and the multiplexer 44 establishes the connection $E_2$-S, while the transmission of $E_1$ to S is established inside the multiplexer 46.

When the functions of another filter are to be realized, it will be necessary, as stated before, to save the content of the register 20 in the memory of the microprocessor 2. To this end use is made of the instruction J4 which, when decoded, makes the signal SVG assume the value 1 at the instant $t_6$; the outputs of the register 20 are connected to the bus BUSD via the register 39 and the group 52.

What is claimed is:

1. A data processing apparatus comprising:
    a random access memory for storing data in a plurality of addresses therein;
    an address register for storing and accessing any address in said memory;
    an incrementation circuit connected to said address register for selectively incrementing or decrementing the address stored therein;
    a first auxiliary register for storing a minimum address value;
    a second auxiliary register for storing a maximum address value;
    address comparison means having a first input connected to said address register, a second input selectively connectable to either of said first and second auxiliary registers, and an output at which an equality signal is produced when an address signal at the first input matches an address signal at the second input; and
    address cycling means for controlling the cyclic accessing of successive addresses in said memory in opposite directions between said minimum and maximum address values, such address cycling means having first and second operating states such that:
    (i) in said first operating state said address cycling means actuates said incrementation circuit to increment the address in said address register; connects the second auxiliary register to said second input of said address comparison means; and, in response to an equality signal produced at the output of said address comparison means, connects the first auxiliary register to said address register to load said minimum address value therein; and
    (ii) in said second operating state said address cycling means actuates said incrementation circuit to decrement the address in said address register; connects the first auxiliary register to said second input of said address comparison means; and, in response to an equality signal produced at the output of said address comparison means, connects the second auxiliary register to said address register to load said maximum address value therein;
    whereby the data in said random access memory at addresses therein between said minimum and maximum address values may be cyclically accessed in selectively opposite directions.

2. A data processing apparatus as claimed in claim 1, in combination with a microprocessor system comprising an instruction bus, a data bus and a memory; such apparatus further comprising a circuit for loading said auxiliary registers in response to instruction received from the instruction bus and for loading said principal register with data received from the data bus.

3. A data processing apparatus as claimed in claim 2, further comprising connection means between an input of the principal register and the data bus in order to store the content of the principal register in the memory of the microprocessor system.

* * * * *